United States Patent
Goldfarb et al.

(10) Patent No.: US 6,400,227 B1
(45) Date of Patent: Jun. 4, 2002

(54) STEPPED GAIN CONTROLLED RF DRIVER AMPLIFIER IN CMOS

(75) Inventors: Marc Goldfarb, Atkinson, NH (US); Rosamaria Croughwell, Methuen; Peter Katzin, Arlington, both of MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/871,446

(22) Filed: May 31, 2001

(51) Int. Cl.[7] .............................. H03F 3/68
(52) U.S. Cl. ........................ 330/295; 330/285
(58) Field of Search ................ 330/51, 285, 295, 330/133, 134

(56) References Cited

U.S. PATENT DOCUMENTS

| | | | |
|---|---|---|---|
| 5,572,166 A | 11/1996 | Gilbert | 330/254 |
| 5,684,431 A | 11/1997 | Gilbert et al. | 330/254 |
| 5,920,230 A | * 7/1999 | Beall | 330/54 |
| 6,064,264 A | * 5/2000 | Tarsia et al. | 330/277 |
| 6,121,842 A | * 9/2000 | Adlerstein et al. | 330/307 |
| 6,252,463 B1 | * 6/2001 | Kobayashi | 330/311 |

OTHER PUBLICATIONS

CDMA 3 V Transmitter If Subsystem with Integrated Voltage Regulator, Analog Devices, AD6122 (2000), pp. 1–20.

* cited by examiner

*Primary Examiner*—Robert Pascal
*Assistant Examiner*—Henry Choe
(74) *Attorney, Agent, or Firm*—Koppel, Jacobs, Patrick & Heybl

(57) ABSTRACT

A variable gain amplifier has at least two branches connected in parallel to drive a common output load. Each branch includes at least two FETs in a cascode configuration. A first FET in each branch is arranged to receive an input signal and to amplify the signal in a common source configuration; the second FET is arranged in a common gate configuration with its source receiving the output current of the first FET. The gate of the second FET is coupled to a corresponding gain control input so that the second FET is enabled when the gate receives an enabling gain control signal and disabled otherwise. Preferably the first and second FETs in each branch are biased in a saturation region of operation when the second FET is enabled by the gain control input. This maintains a low distortion figure throughout the dynamic range of the gain control. Preferably, the invention also includes an active fixed gain power amplification stage for coupling the output to a power amplifier.

26 Claims, 2 Drawing Sheets

STEPPED GAIN CONTROLLED RF DRIVER AMPLIFIER IN CMOS

BACKGROUND OF THE INVENTION

1. Field of the Invention

This invention relates to semiconductor radio frequency (RF) amplifiers generally, and more specifically to variable gain RF driver amplifiers using CMOS in the gigahertz frequency range.

2. Description of the Related Art

Variable gain RF driver amplifiers find use in many applications. For example, to maintain the signal quality in a code division multiple access (CDMA) mobile transmitter it is necessary to maintain precise control of the transmitted power over a wide dynamic range. Typically, gain control is divided between two stages in the transmitter: the intermediate frequency (IF) variable gain amplifier and the RF driver amplifier.

Gain control in RF driver amplifiers has conventionally been implemented as a continuously variable gain control circuit, having an analog gain control signal input. For example, in one approach an FET can be used in its triode region as a voltage variable resistor. When such a voltage variable resistor is placed in a feedback loop, voltage variable gain results. This approach does allow variable gain, but over a limited range and with often poor linearity. Proper compensation of such a circuit is required for stability, which is problematic in the gigahertz frequency range. Typically Silicon or GaAs bipolar transistors are used, and are not easily integrated with digital CMOS technologies. Digital CMOS technologies are cost effective and increasingly dominant in digital communication devices.

Another conventional approach is to vary the bias voltage or current to the active components of the driver amplifier. This approach does not necessarily conserve power in the low bias state, and consequently does nothing to extend battery life in portable applications. This approach also has the additional disadvantage that the driver active components are not constantly biased in their most favorable region to reduce intermodulation and other distortion products. Thus, in certain gain regions the variable bias circuit will produce a low quality output, characterized by high distortion.

Both of the aforementioned methods of gain control also require a suitable analog gain control signal for control.

SUMMARY OF THE INVENTION

In view of the above problems, the present invention is an integrated circuit, MOSFET, variable gain amplifier suitable for operation in the gigahertz region and suitable for integration with or direct interfacing with digital CMOS gain control circuits.

The variable gain amplifier in accordance with the invention has at least two amplifier branches connected in parallel to drive a common output load. Each branch includes at least two FETs in a common source—common gate configuration referred to as a cascode. A first FET in each branch is arranged to receive an input signal and to amplify the signal in a common source configuration; the second FET is arranged in a common gate configuration with its source receiving the output current of the first FET. The gate of the second FET is coupled to a corresponding gain control input so that the second FET is enabled when the gate receives an enabling gain control signal and disabled otherwise.

In one embodiment, the variable gain amplifier has four branches in which corresponding FETs have widths which differ according to a predetermined ratio, suitably a 1:2:4:4 ratio. This invention anticipates both binary and non-binary weight combination of FET sizes. Preferably the first and second FETs in each branch are biased in a substantially saturation region of operation when the second FET is enabled by the gain control input. This maintains a low distortion figure throughout the dynamic range of the gain control.

These and other features and advantages of the invention will be apparent to those skilled in the art from the following detailed description of preferred embodiments, taken together with the accompanying drawings, in which:

BRIEF DESCRIPTION OF THE DRAWINGS

FIG. 3 is a plot of voltage gain (in decibels) as a function of frequency (in gigahertz) for a particular embodiment of the invention, suitable for operation in the 2 gigahertz region.

DETAILED DESCRIPTION OF THE INVENTION

Figure 1:
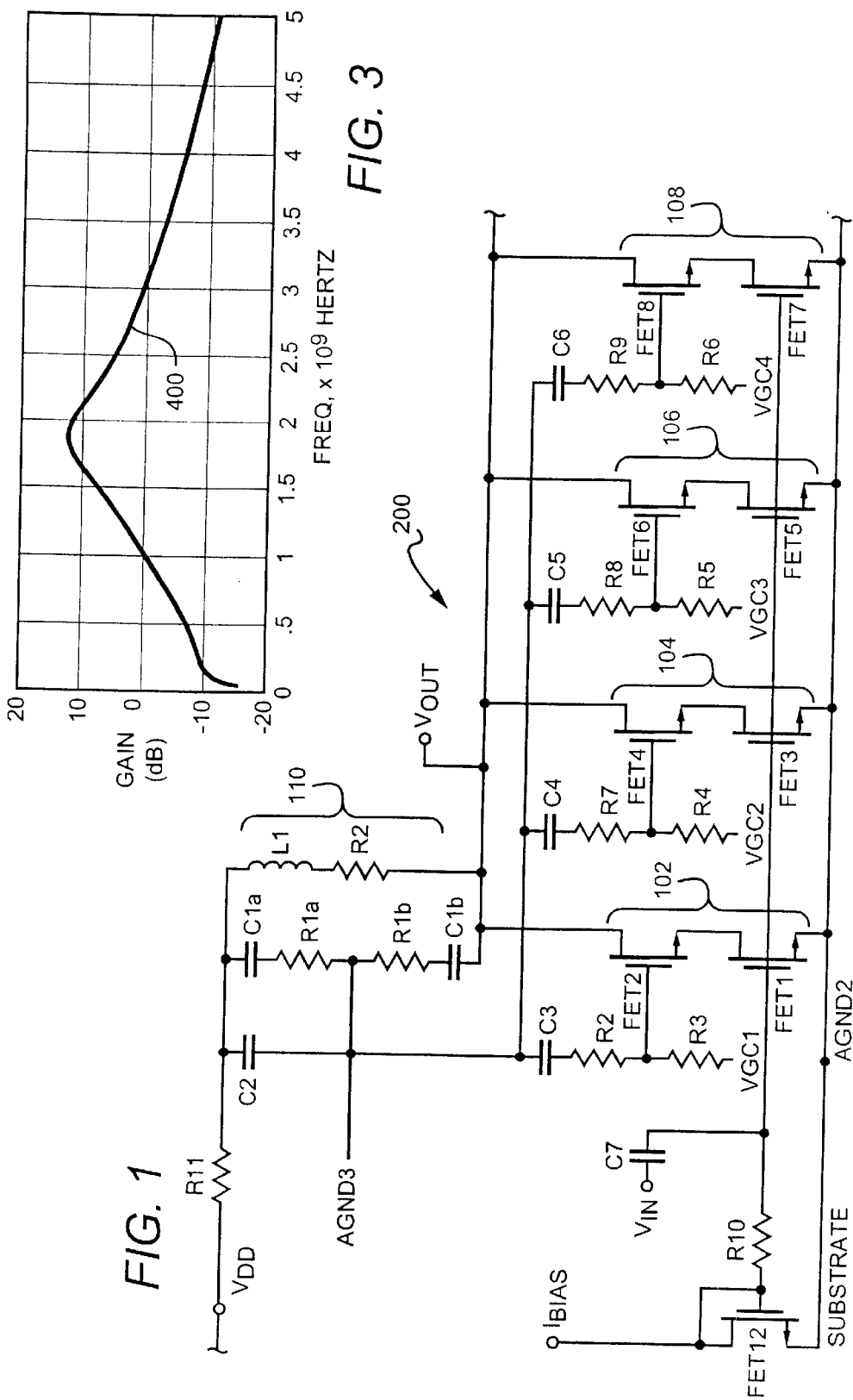
FIG. 1 is a schematic diagram of a variable gain RF driver amplifier in accordance with the invention.

FIG. 1 shows an amplifier circuit in accordance with the invention. By way of example, the figure shows four amplifier branches 102, 104, 106 and 108, all connected in parallel. More or fewer branches are possible and are consistent with the invention, provided that at least two branches are present.

Each of the parallel branches preferably comprises an amplifier having at least two FETs connected in a cascode configuration. For example, branch 102 comprises the cascode amplifier of FET1 (connected in a common source configuration) connected in cascode to FET2 (which is connected in a common gate configuration). The multiple branches are preferably commonly driven by a single input Vin by connecting the inputs in parallel as shown: the gates of FET1, FET3, FET5 and FET 7 are connected in parallel and coupled to receive Vin.

In each parallel branch the gate of the common gate FET (FET2 in branch 102) is coupled through an isolation resistor (R3–R6) to a gain control input. The gain control inputs VGC1–VGC4 are activated or disabled by a control circuit (not shown in FIG. 1) to enable a desired combination of branches and thus a desired gain level. For example, for minimum gain, only one of the gain control inputs (e.g. VGC4) is switched on (high) to enable the corresponding cascode branch (108) to amplify; for maximum gain, all gain control inputs VGC1–VGC4 are switched on thereby enabling all of the amplifier branches, 102–108 in parallel. Intermediate gain levels are selectable by switching on a combination of gain control inputs as required to obtain a desired current gain.

The signal input to the variable gain amplifier is suitably coupled as shown to the gates of the multiple common source amplifier stages, connected typically in parallel (although other input coupling networks could also be suitably used). Thus, in the embodiment illustrated, the gates of FET1, FET3, FET5, and FET7 are connected in parallel through coupling capacitor C7 to the signal input. As the gate voltage to these devices is maintained independent of gain state, the input impedance of this stage remains relatively constant. This is an important advantage to the design of stages that precede the amplifier. Similarly, the drains of the common gate amplifier FETs (FET2, FET4, FET6, and FET8) are connected through a resonant load (provided by the network 110 of L1, C1a, C1b, and R1a and R2b), a decoupling capacitor C2 and an isolation resistor R11 to a voltage source $V_{DD}$.

In a simple embodiment of the invention, all of the amplifier branches can be essentially identical. In such a design the power gain of the circuit is approximately proportional to the number of branches that are enabled. However, other embodiments are also possible and in accordance with the invention. For example, the physical dimensions of the FETs can differ, or the DC bias levels applied to the gates of FET2, FET4, FET6, etc. could differ to provide a wider, non-binary range of gain control.

In the particularly useful embodiment shown in FIG. 1 the channel widths of the FETs (FET1–FET8) are fabricated according to a specific, predetermined set of ratios. Table 1 gives suitable component values for use in FIG. 1 to provide a relatively wide band, variable gain amplifier for use in the 2 Ghz region.

TABLE 1

| | |
|---|---|
| C1a | .85 pf |
| C1b | .35 pf |
| C2 | 21.49 pf |
| C3 | 5.51 pf |
| C4 | 5.51 pf |
| C5 | 5.51 pf |
| C6 | 5.51 pf |
| C7 | . 920 pf |
| L1 | 6.5 nanohenry |
| R1a | 10 Ohm |
| R1b | 10 Ohm |
| R2 | 8.296 Ohm |
| R3 | 5K Ohm |
| R4 | 5K Ohm |
| R5 | 5K Ohm |
| R6 | 5K Ohm |
| R7 | 8.296 Ohm |
| R8 | 8.296 Ohm |
| R9 | 8.296 Ohm |
| R10 | 1K |

This results in transconductance ratios, expressed in terms of branch 102: branch 104: branch 106: branch 108, of 4:4:2:1, producing typical bias currents of 2 ma (branch 102), 2 ma (branch 104), 1 ma (branch 106) and 500 microamps (branch 108). Different combinations of these branches can be enabled by appropriately enabling the correct combination of VGC inputs (VGC1–VGC4) to produce total bias current (for all the parallel branches) anywhere from 500 microamps up to 5.5 milliamps in 0.5 ma steps. This is an important feature of the design as DC current is reduced as output power and the gain of the stage is reduced. This improves battery life in applications such as cellular handsets.

The load impedance of network 110, which includes C1a, C1b, R1a, R1b, L1 and R2, should be designed with a quality (Q) factor, which is appropriate to the gain, bandwidth, and process control of the particular application. In this embodiment, a Q of approximately seven (7) has been chosen to achieve adequate performance simultaneously with the ability to produce this design with a high production yields. Elements R1a, R1b, C1a, C1b, and R2 represent parasitic resistances and capacitances, which are unavoidable in any physical implementation of the circuit.

A preferred embodiment of the invention also includes at least one precise bias control and compensation circuit which maintains the bias points of the branch amplifiers, preferably at an optimum bias to reduce distortion (intermodulation or other distortion products). For example, in FIG. 1 bias points for FETs 1, 3, 5 and 7 are controlled by the bias current Ibias. Current mirror FET 12 sets a controlled DC bias voltage level through isolation resistor R10 on the gates of FET1, FET3. FET5 and FET7. Thus, precise control of Ibias causes the operating point of the FETs FET1–FET8 to be precisely set.

Although the operating point for each branch 102–108 will typically be set at a point chosen to reduce intermodulation distortion, the bias is not limited to any particular operating class or design, and could be selected based upon system requirements such as output power, frequency range, efficiency, linearity and heat dissipation capability. For example, class A amplifier stages exhibit good linearity and broad bandwidth, but produce low efficiency and have high dissipation requirements, as is known in the art. On the other hand, Class C biasing will provide reasonably high efficiencies but the amplifier operated in such,- manner will suffer from non-linearity and a somewhat reduced power gain range than that of a class A amplifier.

The circuit of FIG. 1 includes, for each branch 102–108, a circuit path for stabilization feedback. For example, the amplifier branch 102 includes stabilization feedback from the output via the network of C3 and R2. The other branches are stabilized similarly as shown by networks C4 and R7, C5 and R8 and C6 and R9. Preferably, the stabilizing feedback capacitors are resistive, low Q capacitors which improve the stability and wideband characteristics of the amplifier. These feedback capacitors also reduce current consumption because they block current which would otherwise be drained through isolation resistors (e.g., R3) and feedback resistors (e.g., R2) from gain control inputs (e.g., VGC1).

Substrate coupling can lead to gain reduction or instability. This effect can be reduced by enclosing portions of the amplifier in isolated regions, and by employing a low resistance implant surrounding these regions. These regions are then connected to ground by independent grounding paths. Electric coupling of RF energy into the substrate by inductors is another area of concern in gigahertz frequency region designs on silicon, both for stability and loss reasons. In this embodiment of the design, inductors are designed with an electrostatic shield, patterned with periodic slots, between the inductor-and the silicon to reduce capacitive coupling of RF energy into the substrate. These shields are grounded to their respective isolation regions. The periodic slots prevent the flow of eddy currents in the shield that would reduce the inductance of the spiral inductor.

Figure 2:
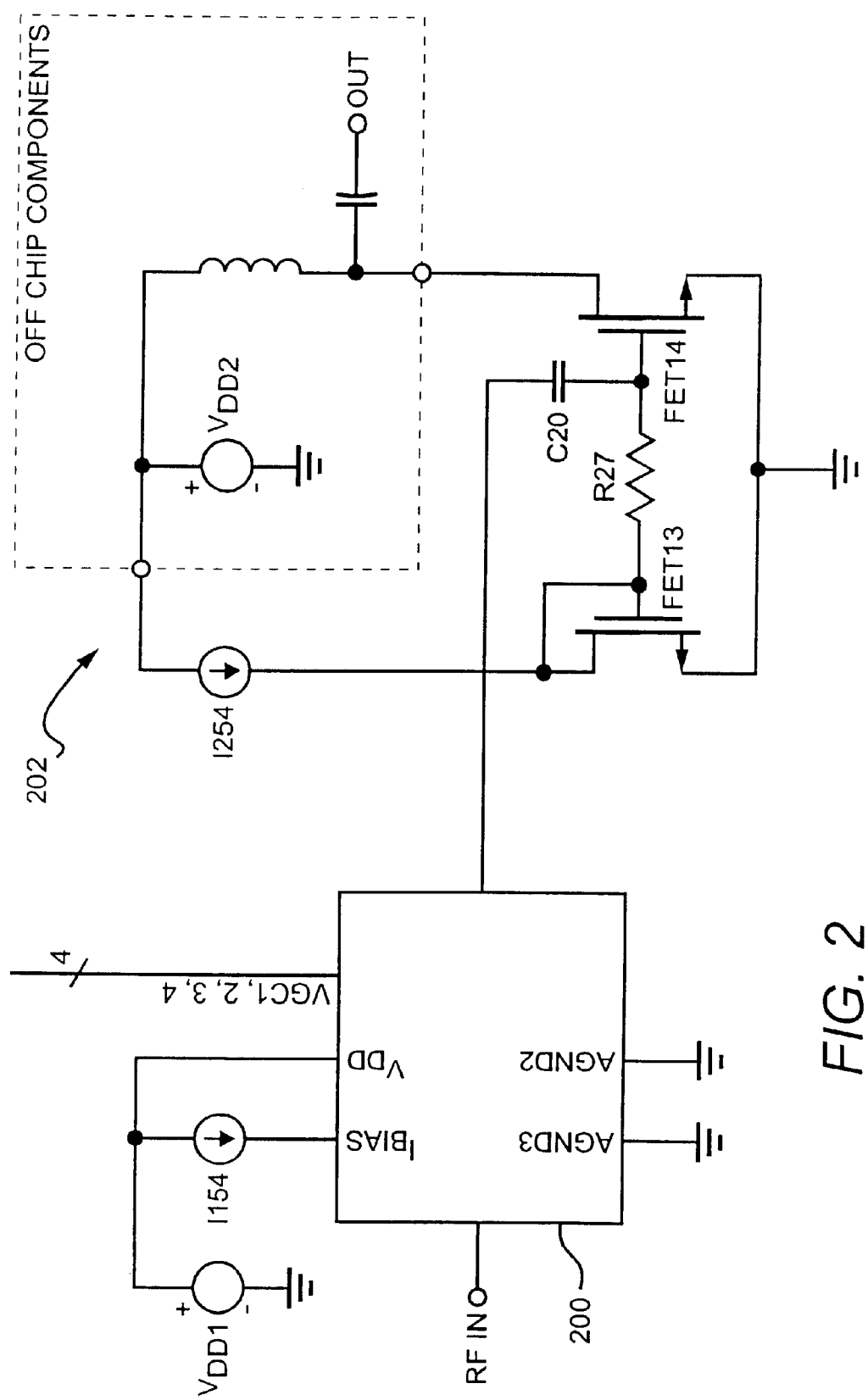
FIG. 2 is a schematic diagram of a variable gain RF amplifier incorporating the circuit of FIG. 1 together with a suitable variable impedance output matching circuit, in accordance with a particular embodiment of the invention.

The circuit of FIG. 1, referenced generally as circuit 200, is shown in FIG. 2 with typical supporting circuitry of current source I154 and voltage source $V_{DD1}$ (wherein the single input Mm of FIG. 1 is shown as an input signal RF IN). The additional circuitry is shown as external, but it could optionally be integrated with the circuit 200 of FIG. 1 (to the extent practical consistent with the inductors required).

Referring now to FIG. 2, the function of the network 202 is to provide a power gain stage following the variable gain amplifier 200. The impedance presented to the output of the variable gain amplifier 200 is fixed to a value that provides adequate gain in the highest switched gain configuration. For a typical circuit with the component values as given above in Table 1, a FET14 with 300 micron channel width and 0.24 micron length is suitable, for use with a MIM (metal-insulator-metal) capacitor C20 with a capacitance on the order of 1.6 picofarad.

With structure similar to that of FIG. 1, bias control is achieved with current mirror FET 13 which mirrors the current of current source I254 through an isolation resistor R27 to the common source amplifier of FET14. An output coupling capacitor and a load inductor for the common source amplifier are preferably located off chip along with an off chip voltage source VDD2.

The circuit of the invention is advantageous in at least several respects: first, unlike many variable gain amplifiers, the DC current consumption of the invention will decrease as gain is decreased, because unused branches of the circuit are switched off. This allows power savings in situations where high transmitter power is not required for communication.

Secondly, the circuit of the invention allows the amplifier transistors to be biased at their most favorable operating point, to minimize distortion, independent of whether the amplifier is operated at high or low gain. Each driver branch is either off or on, and when on operates at the operating point set by the bias control circuit. Preferably, the bias control circuit will be set at a favorable operating point to reduce intermodulation distortion (in a substantially linear operating region). That bias point is substantially maintained in each branch independent of the gain level. Only the number of active parallel branches changes in response to gain control selection, not the bias point in each branch.

Further, the circuit is advantageous because it lends itself to digital control and is easily integrated with CMOS digital circuitry. A CMOS decoder, for example, can suitably and easily be integrated on the same substrate with the variable gain amplifier and/or other circuitry as well. Such integration with CMOS is not easily accomplished with other RF variable gain amplifier technologies such as Gallium Arsenide (GaAs) MESFET.

A CMOS decoder can suitably and easily be integrated on the same substrate with the variable gain amplifier and/or other circuitry as well. Such integration with CMOS is not so easily accomplished with other RF variable gain amplifier technologies such as Gallium Arsenide (GaAs) MESFET.

FIG. 3 shows a typical frequency response characteristic for the circuit of FIG. 1. The response shows favorable broadband characteristics, with more than 12 db of voltage gain at around 2 gigahertz. The plot 400 in FIG. 3 illustrates the maximum voltage gain for the circuit of FIG. 1, in the case with all branches 102–108 enabled. Lesser gain configurations produce proportionately less gain, with substantially the same gain vs. frequency characteristics as shown for the maximum gain case.

The variable gain amplifier according to the invention produces extremely favorably low intermodulation distortion. For example, simulation was performed for the circuit of FIG. 1 with the component values as given in table 1. For a two-tone test with input tones at 1.85 and 1.90 gigahertz, third-order intermodulation products were attenuated by 52 decibels, with the amplifier configured for maximum gain (all branches enabled). The intermodulation at lower gain configurations is at a substantially similar proportional level.

While several illustrative embodiments of the invention have been shown and described, numerous variations and alternate embodiments will occur to those skilled in the art. For example, more or fewer branches could be used in the variable gain amplifier. Different tuning or impedance matching output or input networks could be incorporated. Such variations and alternate embodiments are contemplated, and can be made without departing from the spirit and scope of the invention as defined in the appended claims.

We claim:

1. An integrated circuit variable gain amplifier, suitable for operation in the gigahertz region, comprising:

at least two amplifier branches, connected in parallel to drive a common output load, each amplifier branch comprising:

a first FET, arranged to receive an input signal and to amplify said input signal in a common source amplifier configuration, and a second FET, arranged in a common gate configuration with its source receiving the drain current of said first FET;

wherein, for each amplifier branch, the gate of said second FET is coupled to a corresponding gain control input which switches said second FET between off and on states;

and wherein at least one of said amplifier branches further comprises a stabilization feedback circuit path.

2. The variable gain amplifier of claim 1, wherein corresponding FETs in different amplifier branches have widths that differ according to a predetermined ratio.

3. The variable gain amplifier of claim 1, wherein said at least two amplifier branches are four in number.

4. The variable gain amplifier of claim 1, wherein corresponding FETs in different amplifier branches have channel widths with substantially a 1:2:4:4 ratio.

5. The variable gain amplifier of claim 1, wherein said first and second FETs are biased in a saturation region of operation when said second FET is also operated in this region.

6. The variable gain amplifier of claim 1, wherein said stabilization feedback circuit path includes a resistor coupled to the gate of said second FET.

7. The variable gain amplifier of claim 1, wherein said stabilization feedback circuit path includes a capacitor coupled to the gate of said second FET.

8. An amplifier having a gain between an input port and an output port that varies in response to gain control signals, comprising:

a plurality of cascode stages that each includes:
 a) an common source amplifier coupled to said input port; and
 b) a common gate amplifier having a gate and coupled between said common source amplifier and said output port; and
 c) a stabilization feedback network coupled to said gate; and a current mirror coupled to mirror current to the common source amplifier of at least one of said cascode stages;

said gain varied by coupling said gain control signals to said control gate of at least one of said cascode stages.

9. The amplifier of claim 8, wherein said stabilization feedback network includes a resistor.

10. The amplifier of claim 8, wherein said stabilization feedback network includes a capacitor.

11. The amplifier of claim 8, wherein at least two of said cascode stages have different channel widths.

12. The amplifier of claim 8, wherein each of said cascode stages further includes a resistor coupled to said gate to receive said gain control signals.

13. An amplifier having a gain between an input port and an output port that varies in response to gain control signals, comprising:

an output common source amplifier coupled to said output port and having a output gate; and a plurality of cascode stages that each includes:
  a) an input common source amplifier coupled to said input port;
  b) a common gate amplifier having a control gate and coupled between said common source amplifier and said output gate; and
  c) a stabilization feedback network coupled to said control gate;

said gain varied by coupling said gain control signals to the control gates of said cascode stages.

14. The amplifier of claim 13, wherein said stabilization feedback network includes a resistor.

15. The amplifier of claim 13, wherein said stabilization feedback network includes a capacitor.

16. The amplifier of claim 13, further including a current mirror coupled to mirror current to said output common source amplifier.

17. The amplifier of claim 13, wherein at least two of said cascode stages have different channel widths.

18. The amplifier of claim 13, wherein each of said cascode stages further includes a resistor coupled to said control gate to receive said gain control signals.

19. The amplifier of claim 13, wherein each of said output common source amplifier, said input common source amplifier and said common gate amplifier is formed with a metal oxide semiconductor (MOS) field effect transistor (FET).

20. A variable-gain amplifier, comprising:
an output common source amplifier;
a plurality of cascode stages coupled in parallel to drive said output common source amplifier and each having:
  a) an input common source amplifier;
  b) a common gate amplifier having a control gate and coupled between said input common source amplifier and said output common source amplifier; and
  c) a stabilization feedback network coupled to said control gate; and
a current mirror coupled to mirror current to said input common source amplifier;
the gain of said amplifier varied by applying gain control signals to the control gate of at least one of said cascode stages.

21. The amplifier of claim 20, wherein said stabilization feedback network includes a resistor.

22. The amplifier of claim 20, wherein said stabilization feedback network includes a capacitor.

23. The amplifier of claim 20, further including a current mirror coupled to mirror current to said output common source amplifier.

24. The amplifier of claim 20, wherein at least two of said cascode stages have different channel widths.

25. The amplifier of claim 20, wherein each of said cascode stages further includes a resistor coupled to said control gate to receive said gain control signals.

26. The amplifier of claim 20, wherein each of said output common source amplifier, said input common source amplifier and said common gate amplifier is formed with a metal oxide semiconductor (MOS) field effect transistor (FET).

* * * * *